(12) United States Patent
Pohlman et al.

(10) Patent No.: US 6,703,814 B2
(45) Date of Patent: *Mar. 9, 2004

(54) APPARATUS FOR PROVIDING REGULATED POWER TO AN INTEGRATED CIRCUIT

(75) Inventors: William Pohlman, Phoenix, AZ (US); Michael Eisele, Paradise Valley, AZ (US)

(73) Assignee: Primarion, Inc., Tempe, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 10/136,209

(22) Filed: May 1, 2002

(65) Prior Publication Data

US 2002/0125868 A1 Sep. 12, 2002

Related U.S. Application Data

(63) Continuation of application No. 09/771,756, filed on Jan. 29, 2001, now Pat. No. 6,429,630.
(60) Provisional application No. 60/178,421, filed on Jan. 27, 2000.

(51) Int. Cl.[7] .............................. G05F 1/56; G05F 1/618
(52) U.S. Cl. ....................... 323/272; 323/271; 323/273; 323/274
(58) Field of Search ................................. 323/272, 273, 323/271, 274

(56) References Cited

U.S. PATENT DOCUMENTS

| | | | |
|---|---|---|---|
| 3,675,114 A | 7/1972 | Nercessian ................... 323/269 |
| 4,675,770 A | 6/1987 | Johansson .................... 361/269 |
| 5,083,078 A | * | 1/1992 | Kubler et al. ................ 323/268 |
| 5,216,351 A | * | 6/1993 | Shimoda ...................... 323/224 |
| 5,550,729 A | * | 8/1996 | Wissell ......................... 363/65 |
| 5,563,838 A | | 10/1996 | Mart et al. .................... 365/226 |
| 5,574,697 A | | 11/1996 | Manning ...................... 365/226 |
| 5,629,608 A | | 5/1997 | Budelman .................... 323/268 |
| 5,717,319 A | | 2/1998 | Jokinen ........................ 323/280 |
| 5,777,383 A | | 7/1998 | Stager et al. ................. 257/700 |
| 5,818,780 A | | 10/1998 | Manning ...................... 365/226 |
| 5,835,979 A | | 11/1998 | Hiraki et al. ................... 174/33 |
| 5,852,359 A | | 12/1998 | Callahan, Jr. et al. ....... 323/274 |
| 5,864,225 A | | 1/1999 | Bryson ......................... 323/268 |
| 5,914,873 A | | 6/1999 | Blish ............................ 363/147 |
| 5,938,769 A | | 8/1999 | Hu ................................ 713/30 |
| 5,945,941 A | | 8/1999 | Rich et al. .................... 342/157 |
| 6,009,034 A | | 12/1999 | Manning ...................... 365/226 |
| 6,014,299 A | | 1/2000 | Hsieh ............................. 361/79 |
| 6,028,417 A | | 2/2000 | Ang et al. ..................... 323/209 |
| 6,049,973 A | | 4/2000 | Frank, Jr. et al. .............. 29/830 |
| 6,271,604 B1 | | 8/2001 | Frank, Jr. et al. ............ 307/112 |
| 6,297,955 B1 | | 10/2001 | Frank, Jr. et al. ............ 361/686 |
| 6,424,128 B1 | * | 7/2002 | Hiraki et al. ................. 323/268 |
| 6,594,556 B1 | * | 7/2003 | Agatstein et al. ............ 700/298 |

FOREIGN PATENT DOCUMENTS

EP    0 922 636    6/1999

\* cited by examiner

*Primary Examiner*—Bao Q. Vu
(74) *Attorney, Agent, or Firm*—Snell & Wilmer L.L.P.

(57) ABSTRACT

A regulator system for supplying power to a microelectronic device is disclosed. The system includes an array of a plurality of regulators, where each regulator provides a portion of power required to operate the device. The system may further include an intermediate power regulator that supplies power to the array of regulators.

20 Claims, 3 Drawing Sheets

APPARATUS FOR PROVIDING REGULATED POWER TO AN INTEGRATED CIRCUIT

This application claims priority to U.S. Provisional Application Serial No. 60/178,421, filed Jan. 27, 2000, entitled "Apparatus for Regulating Power to an Integrated Circuit" and is a continuation application of U.S. application Ser. No. 09/771,756, filed Jan. 29, 2001, now U.S. Pat. No. 6,429,630, entitled "Apparatus for Providing Regulated Power to an Integrated Circuit."

CROSS REFERENCE TO RELATED APPLICATIONS

This application claims priority to U.S. Provisional Application Serial No. 60/178,421, filed Jan. 27, 2000, entitled "Apparatus for Regulating Power to an Integrated Circuit."

TECHNICAL FIELD

The present invention generally relates to microelectronic devices. More particularly, the present invention relates to microelectronic devices suitable for regulating power.

BACKGROUND OF THE INVENTION

Regulators are often employed to provide a desired, regulated power to microelectronic devices such as microprocessors. For example, switching regulators such as buck regulators are often used to step down a voltage (e.g., from about 3.3 volts) and provide suitable power to a microprocessor (e.g., about 10–30 amps and about 2–3 volts).

To increase speed and reduce costs associated with microprocessors, microprocessor gate counts and integration generally increase, while the size of the microprocessor per gate generally decreases. As gate counts, speed, and integration of microprocessors increase, supplying requisite power to microprocessors becomes increasingly problematic. For example, a current required to drive the processors generally increases as the number of processor gates increases. Moreover, as the gate count increases per surface area of a processor, the operating voltage of the processor must typically decrease to, among other reasons, reduce overall power consumption of the processor. Furthermore, as the microprocessor speed increases, the microprocessors demand the higher current at faster speeds.

Although buck regulators are generally suitable for controlling power to some microprocessors, such regulators are not well suited to supply relatively high current (e.g., greater than about 30 amps) at relatively high speed (e.g., greater than about 500 MHz.). One reason that buck regulators have difficulty supplying high current at high speed to the microprocessor is that the current supplied from the regulator to the processor has to travel a conductive path that generally includes a portion of a printed circuit board that couples the processor to the regulator. The relatively long conductive path between the processor and the regulator slows a speed at which the regulator is able to supply current to the processor. In addition, as microprocessor speed and current demands increase, the buck controller simply cannot provide the desired amount of current at the desired rate.

Yet another problem with buck regulators is that they are generally configured to supply power to within about ±5% of a desired value. While this range may be acceptable for processors running at relatively low currents, this range becomes decreasingly acceptable as the current requirements of microprocessors increase. Thus, as microprocessor gate counts and clock speeds increase, improved methods and apparatus for supplying high current at high speed and low voltage are desired. Furthermore, methods and apparatus for supplying the relatively high current within a relatively tight tolerance is desired.

SUMMARY OF THE INVENTION

The present invention provides improved apparatus and techniques for providing regulated power to a microelectronic device. More particularly, the invention provides improved devices and methods suitable for supplying electronic devices with relatively high, regulated current at relatively high speed.

The way in which the present invention addresses the deficiencies of now-known regulators and power supply systems is discussed in greater detail below. However, in general, the present invention provides an array of power regulators that provides power to a single microelectronic device.

In accordance with one exemplary embodiment of the present invention, an array of regulators is configured to provide power to a microprocessor. In accordance with one aspect of this embodiment, the array is formed as an integrated circuit on a semiconductor substrate. In accordance with a further aspect of this embodiment, the circuit is coupled to the microprocessor through a relatively short conductive path (e.g., by coupling the circuit to the device via bump interconnects). In accordance with yet a further aspect of this embodiment, the array circuit is formed on a silicon germanium (SiGe) substrate to facilitate faster current supply to the device. In accordance with a further exemplary embodiment of the present invention, a tiered power regulation system is configured to provide power to a microelectronic device. The tiered system includes at least two levels of power regulation. In accordance with an exemplary aspect of this embodiment, a first level of power regulation includes a switching regulator and a second level of regulation includes a linear regulator. In accordance with a further aspect of this embodiment, the second level of regulation includes an array of linear regulators.

DETAILED DESCRIPTION OF EXEMPLARY EMBODIMENTS

The present invention generally relates to microelectronic power regulators. More particularly, the invention relates to regulators suitable for providing high current, high speed power to microelectronic devices and to electronic systems including the regulators. Although the present invention may be used to provide power to a variety of microelectronic devices, the invention is conveniently described below in connection with providing power to microprocessors.

Figure 1:
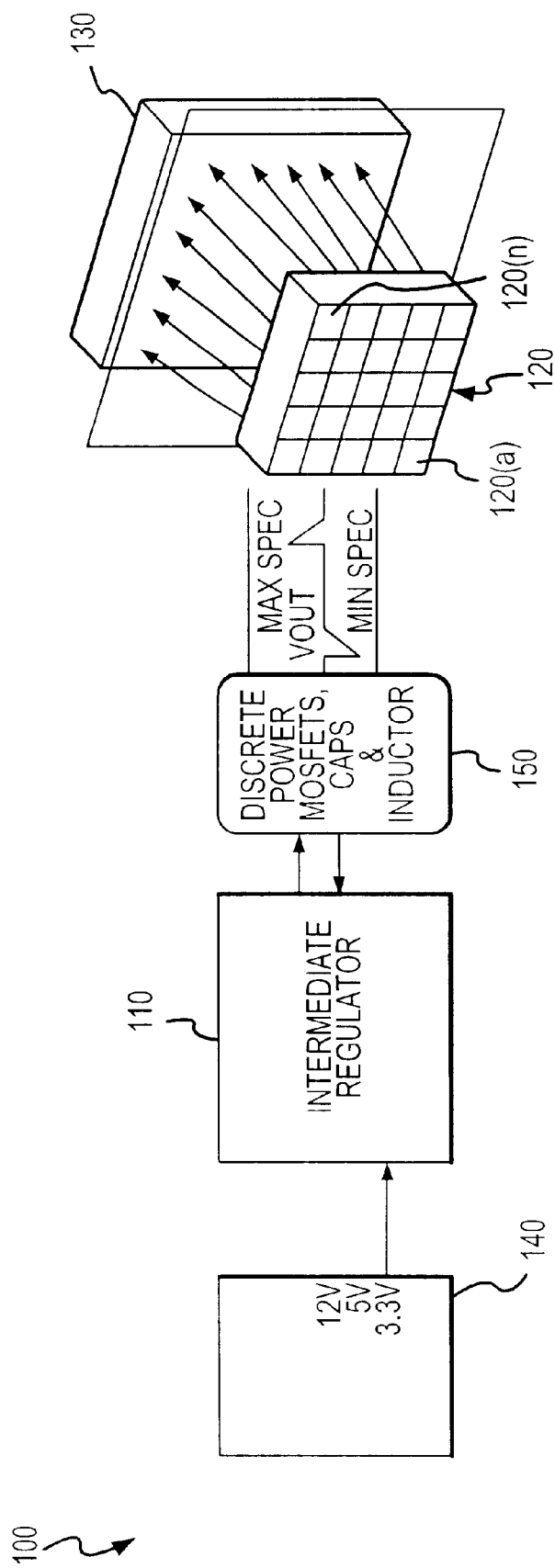
FIG. 1 illustrates a power regulation system in accordance with an exemplary embodiment of the present invention.

An exemplary power supply system 100 in accordance with the present invention is schematically illustrated in FIG. 1. As illustrated, system 100 includes an intermediate regulator 110, a regulator array 120, including regulators 120(a)–120(n), and a microprocessor 130. System 100 may also suitably include a power converter 140 and one or more discrete electronic components, collectively represented as components 150.

In general, system 100 is configured to provide relatively high current (e.g., 30 to more than 100 amps) at relatively low voltage (e.g., down to about 1 volt or less) with a relatively short response time. As discussed in greater detail below, in accordance with the present invention, system 100 provides the high current power to microprocessor 130 by distributing the power regulating duty to a plurality of regulators (e.g. regulator 110 and/or regulators 120(a)–120(n)).

Converter 140 of system 100 is generally configured to convert alternating current (AC) power obtained from a typical AC power outlet to direct current (DC) power to, for example, provide suitable DC power for a motherboard of a computer. For example, in accordance with one exemplary embodiment of the present invention, converter 140 is configured to convert 110 volt AC power to about 3.3 volts to about 15 volts DC power at about 1 amp to about 20 amps. In accordance with one aspect of this embodiment, converter 140 includes multiple DC power outputs—e.g., about 12 volts at about 1 amp, about 5 volts at about 5 amps, at about 3.3 volts at about 30 amps to supply the power to, for example, various types of microelectronic devices which may be coupled to the motherboard. In accordance with alternative embodiments of the present invention, converter 140 may include any number of DC power outputs, and the amount of power associated with each output may vary in accordance with a type of device coupled to the output of converter 140.

Intermediate regulator 110 is a DC-to-DC converter, which is designed to convert output from converter 140 to higher current, lower voltage power. In accordance with one exemplary embodiment of the present invention, regulator 110 receives power (e.g. 3.3 volts at 30 amps) from converter 140 and converts the power to about 1.15 volts at about 100 amps. Regulator 110 may be a linear regulator, a switching regulator, or any other suitable type of power controller; however, in accordance with one exemplary embodiment of the present invention, regulator 110 comprises a switching regulator such as a buck regulator.

System 100 may also optionally include discrete components 150 to facilitate rapid response power transfer from regulator 110 to array 120. In particular, components 150 may include capacitors to store an appropriate charge and discharge the energy as array 120 calls for power from regulator 110.

Regulator 120 is generally configured to provide high current (e.g., up to 100 amps or more) power at a relatively low response time (e.g., at speeds of 500 MHz and above) to microprocessor 130. In accordance with an exemplary embodiment of the present invention, array 120 includes one or more power regulators (e.g., regulators 120(a)-120(n)) configured to transform power received from regulator 110 and/or components 150 and convert the power into higher current, lower voltage power suitable for microprocessor 130.

Array 120 may include any number of regulators, which may be configured and coupled to processor 130 in a variety of ways. For example, array 120 may include a number (n) of substantially identical regulators, wherein each regulator is configured to provide processor 130 with 1/n the operation power of processor 130. However, in accordance with alternate embodiments of the invention, array 120 may be configured with regulators of various sizes that are configured to provide power to various portions of processor 130. For example, array 120 may include relatively high current regulators to provide power to input/output buffers and relatively low current regulators to supply power to logic units of the microprocessor.

Figure 2:
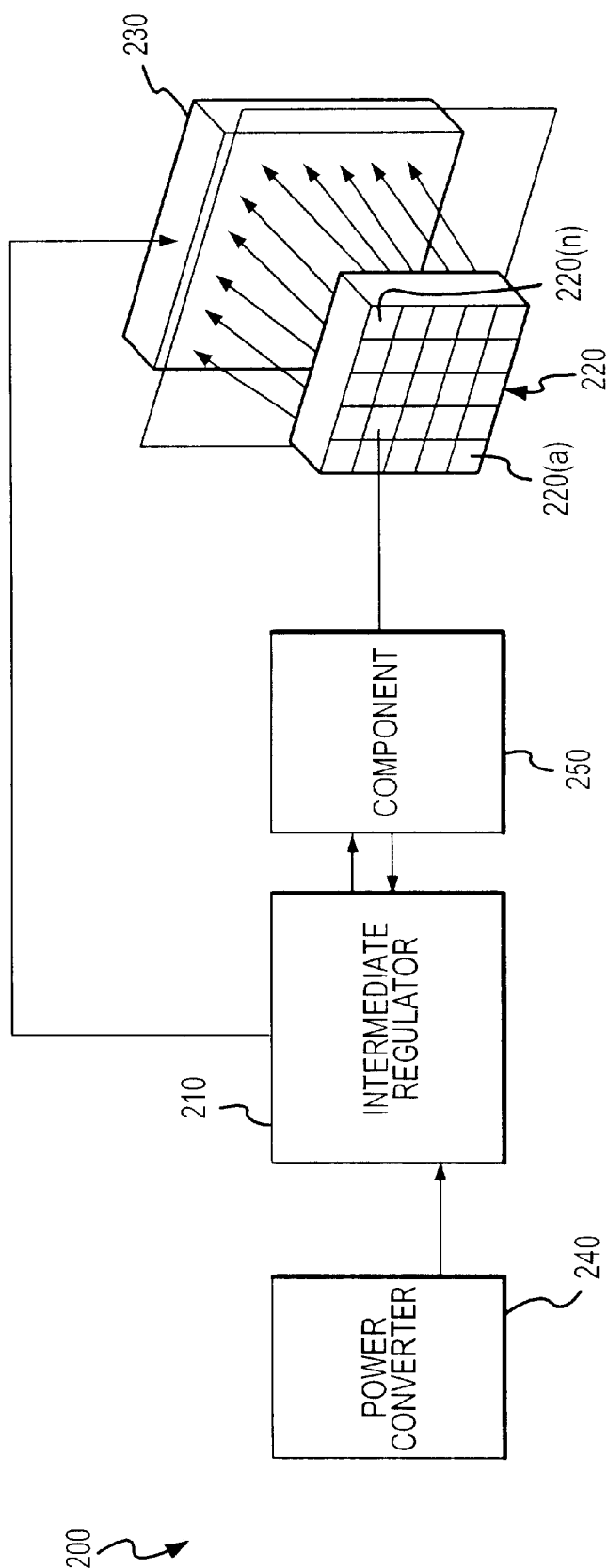
FIG. 2 illustrates a power regulation system in accordance with alternative embodiment of the present invention.

FIG. 2 illustrates a power supply system 200 in accordance with an alternative embodiment of the invention. Similar to system 100, system 200 generally includes an intermediate regulator 210, a regulator array 220, including regulators 220(a)–220(n), a microprocessor 230, and optionally a power converter 240 and components 250.

System 200 is configured such that a portion of power supplied to microprocessor 230 may be derived from regulator 210. For example, in accordance with one aspect of this embodiment, regulator 210 supplies power to input/output contacts of microprocessor 230 and/or a floating point contact of microprocessor 230. However, the invention is not so limited; system 200 may suitably be configured such that regulator 110 provides power to any portion of microprocessor 230.

Figure 3:
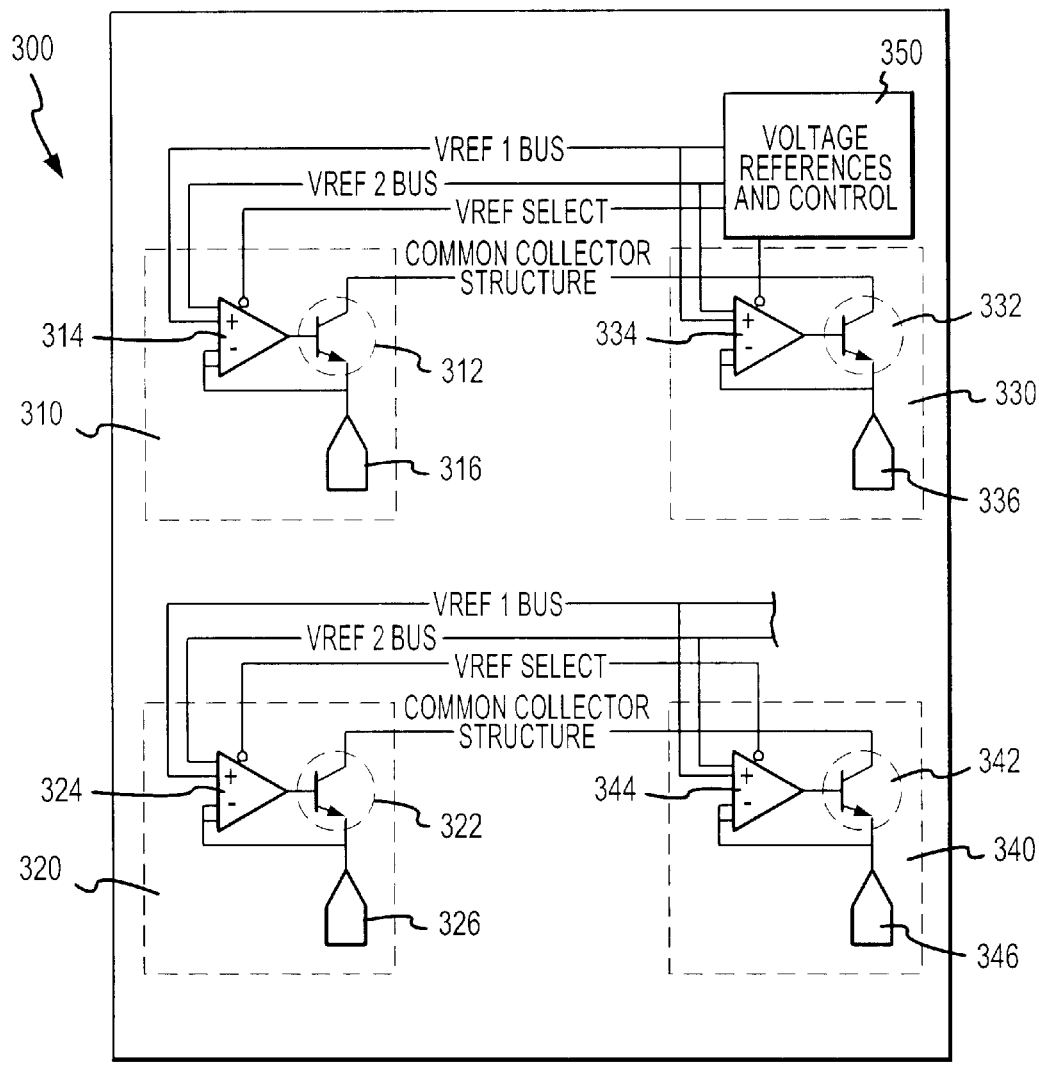
FIG. 3 schematically illustrates a portion of a regulator array in accordance with an exemplary embodiment of the present invention.

FIG. 3 is a schematic illustration of an array 300, showing regulators 310, 320, 330, and 340 coupled to a common voltage reference 350 in accordance with an exemplary embodiment of the present invention. In accordance with the embodiment illustrated in FIG. 3, each regulator 310–340 is configured to supply substantially the same power (at the reference voltage) to a microprocessor—e.g., microprocessor 130.

Regulators 310–340 may include switching regulators, linear regulators, combinations thereof, or other suitable devices for controlling power. In accordance with one exemplary embodiment of the present invention, regulators 310–340 are linear regulators and each regulator 310–340 suitably includes a transistor (e.g., bipolar transistors 312, 322, 332, and 342), an error amplifier (e.g., error amplifier 314, 324, 334, and 344), and a voltage source (e.g., sources 316, 326, 336, and 346).

As noted above, regulators 310–340 are generally configured to provide output power to processor 130 at a voltage substantially equivalent to voltage reference 350. However, regulators 310–340 may suitably be trimmed such that the output voltage can be set to about ±1% of the reference voltage. In accordance with alternative embodiments of the present invention, array 300 may include multiple voltage references at various voltages, with one or more regulators tied to each reference. Use of multiple voltage references allows for power regulation at the various voltage levels to various portions of microprocessor 130.

In accordance with one exemplary embodiment of the invention, all regulators (e.g., regulators 310, 320, 330, and 340) are suitably coupled together in parallel such that, in addition to each regulator being tied to a common reference voltage, each regulator array 300 is tied to a common collector structure. The parallel coupling of regulators within an array allows for a total current output of array 300 which is equal to the sum of current outputs from each regulator within array 300. Thus, time delays associated with larger regulators are mitigated because smaller regulators within an array are used to provide current to a portion or portions of microprocessor 130. In other words, microprocessor 130 does not depend on a single, large regulator to supply requisite current.

A conductive path between array 120 and microprocessor 130, or a portion thereof, is preferably relatively short to reduce the effects of parasitic inductance between an array (e.g. array 120) and microprocessor 130. Providing a relatively short conductive path between array 120 and microprocessor 130 is additionally advantageous because parasitic inductance between array 120 and processor 130 is generally reduced as the distance between the components is reduced. One technique for providing a relatively short conductive path between array 120 and microprocessor 130 in accordance with the present invention is to couple array 120 to processor 130 using conductive bumps such as C4 (Controlled Collapse Chip Connection) bumps. In accordance with various aspects of this embodiment, array 120 may be coupled directly to microprocessor 130, or array 120 may suitably be coupled to a package containing microprocessor 130.

To facilitate fast power delivery from regulators 120(a)–120(n) of array 120 to processor 130, regulators 120(a)–120(n) are formed on a semiconductor substrate having relatively high electron mobility such as silicon germanium (SiGe), Gallium Arsenide (GaAs), or the like. Forming regulators on SiGe or similar substrates that have relatively high electron mobility allows relatively quick power transfer (e.g., on the order of GHz speed) between regulator 120 and microprocessor 130. In addition, semiconductive substrates such as SiGe exhibit a relatively high current density, compared to conventional semiconductor materials, which allows for formation of more transistors per surface area of SiGe compared to substrates having lower current density such as silicon.

In accordance with an alternative embodiment of the present invention, a regulator array and microprocessor 130 are formed on a single semiconductive substrate formed of, for example, SiGe, or other suitable semiconductive materials. Integrating an array and a microprocessor on a single substrate allows for even faster power supply from the array to the microprocessor. The integral array may provide power to all or a portion of the microprocessor and may be in addition to or in lieu of an array, such as array 120 illustrated in FIG. 1.

Although the present invention is set forth herein in the context of the appended drawing figures, it should be appreciated that the invention is not limited to the specific form shown. For example, while the invention is conveniently described above in connection with providing power to a discrete microprocessor, the present invention may suitably be used provide power to a plurality of microelectronic devices. Various other modifications, variations, and enhancements in the design and arrangement of the method and apparatus set forth herein may be made without departing from the spirit and scope of the present invention as set forth in the appended claims.

We claim:

1. A microelectronic regulator array comprising a plurality of regulators coupled together in parallel, said array configured to provide about 110 amps at more than about 500 MHz.

2. The microelectronic regulator array of claim 1, wherein at least a portion of collector regions of said regulators are coupled together.

3. The microelectronic regulator array of claim 1, wherein said plurality of regulators are formed on a substrate comprising a compound semiconductor material.

4. A microelectronic power supply comprising:

a microprocessor;

an array of power regulators coupled to the microprocessor, wherein each of the power regulators is configured to react to fast power demands of the microprocessor and to supply power to the microprocessor at a speed of about 500 MHz or more.

5. The microelectronic power supply of claim 4, wherein the array of power regulators is coupled to the microprocessor using conductive bump technology.

6. The microelectronic power supply of claim 4, wherein at least one of the power regulators comprises compound semiconductor material.

7. The microelectronic power supply of claim 4, wherein at least one of the power regulators comprises silicon germanium.

8. A microelectronic power regulation system comprising an array of power regulators configured to supply power to a microelectronic device at a rate of greater than about 500 MHz, wherein each regulator is formed of compound semiconductor material and is coupled to the microelectronic device using conductive bump technology.

9. The microelectronic power supply of claim 4, wherein a plurality of the regulators in the array are formed on a substrate and each of the regulators of the plurality are configured to provide power to a portion of a microelectronic device.

10. The microelectronic power supply of claim 4, wherein said array is configured to provide about 100 amps or more of power to the microprocessor.

11. The microelectronic power supply of claim 4, wherein said power regulators of said array comprise linear regulators.

12. The microelectronic power supply of claim 4, wherein at least one of said regulators of said array comprises a transistor and an error amplifier.

13. The microelectronic power supply of claim 4, wherein a plurality of said regulators of said array are coupled together in parallel.

14. The microelectronic power supply of claim 4, wherein a plurality of collector regions of said regulators of said array are coupled together.

15. A power regulation system comprising the microelectronic power supply of claim 4, and further comprising an intermediate regulator coupled to said array.

16. The power regulation system of claim 15, wherein said intermediate regulator is a switching power regulator.

17. The power regulation system of claim 15, wherein said intermediate regulator provides power to a microelectronic device and to said array of power regulators.

18. The power regulation system of claim 15, further comprising a power converter coupled to the intermediate regulator.

19. The power regulation system of claim 15, further comprising electronic components coupled to said array of power regulators.

20. The power regulation system of claim 15, wherein said electronic components include capacitors.

* * * * *